United States Patent
Ishizuka (10) Patent No.: US 6,333,655 B1
(45) Date of Patent: Dec. 25, 2001

(54) SEMICONDUCTOR INTEGRATED CIRCUIT AND DUTY DETERIORATION PREVENTING METHOD THEREOF

(75) Inventor: Satoshi Ishizuka, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/466,067

(22) Filed: Dec. 17, 1999

(30) Foreign Application Priority Data

Dec. 18, 1998 (JP) .................................................. 10-360360

(51) Int. Cl.⁷ ...................................................... H03K 3/017
(52) U.S. Cl. ............................................ 327/175; 327/262
(58) Field of Search ..................................... 327/172, 175, 327/262, 307, 362

(56) References Cited

U.S. PATENT DOCUMENTS

| | | | |
|---|---|---|---|
| 5,088,106 | * 2/1992 | Kitamura et al. | 375/214 |
| 5,508,565 | 4/1996 | Hatakeyama et al. | 257/777 |
| 5,994,941 | * 11/1999 | Akimoto et al. | 327/307 |

FOREIGN PATENT DOCUMENTS

| | | |
|---|---|---|
| 62-217713 | 9/1987 | (JP) . |
| 63-54015 | 3/1988 | (JP) . |
| 63-120517 | 5/1988 | (JP) . |
| 63-185115 | 7/1988 | (JP) . |
| 3-80616 | 4/1991 | (JP) . |
| 3-82214 | 4/1991 | (JP) . |
| 8-123591 | 5/1996 | (JP) . |
| 8-335861 | 12/1996 | (JP) . |

* cited by examiner

*Primary Examiner*—Toan Tran
*Assistant Examiner*—Cassandra Cox
(74) *Attorney, Agent, or Firm*—Sughrue Mion, PLLC

(57) ABSTRACT

A first circuit having deteriorated duty is connected to a second circuit having the same circuit arrangement and the same layout as that of the first circuit. The first and second circuits are connected to each other by means of an inversion logic. The difference between a rising time tr and a falling time tf generated in each circuit block of the first circuit is canceled by the circuit block of the second circuit corresponding to that of the first circuit. Accordingly, duty deterioration derived from types of blocks, branching and wiring capacity is prevented without the influence of process variation.

2 Claims, 12 Drawing Sheets

SEMICONDUCTOR INTEGRATED CIRCUIT AND DUTY DETERIORATION PREVENTING METHOD THEREOF

BACKGROUND OF THE INVENTION

1. Field of the Invention

The present invention relates to a semiconductor integrated circuit and a duty deterioration preventing method thereof and particularly relates to a technique for preventing the deterioration of the duty of a propagating signal.

2. Description of the Related Art

The recent computerization or information-oriented trend is characterized by the increase of the quantity of information and higher transfer speed as can be seen from the transfer of images and voice through the Internet, the higher display resolution and the increase of use of mobile communications and the like.

For the purpose of downsizing, systems supporting the information-oriented society are required to be provided not only at low cost but also with high performance, which requirements are prominent for semiconductor integrated circuits serving as the center of the systems.

To realize high-speed, low-cost semiconductor integrated circuits, such measures are taken as one-chip mount, i.e., integrating and mounting a plurality of circuits on a single chip, and the reduction of the number of signal lines.

Accordingly, a circuit arrangement in which the number of signals is reduced by means of parallel/serial signal conversion (to be referred to as "P/S conversion") and a Data-Strobe transfer method for generating a clock signal from a data signal and a strobe signal without using a clock signal to thereby transmit/receive signals at higher transfer speed, becomes a mainstream.

In the P/S conversion, it is essential to ensure timing accuracy of a clock signal relative to a serial signal, to reduce the difference between the rising time (tr) and the falling time (tf) of a serial signal, i.e., to make a duty ratio when the rate of change of a serial signal is the highest, closer to 50%.

Additionally, in case of the Data-Strobe transfer method, it is essential to reduce the skew of the data and strobe signals and to reduce the tr/tf difference between the data signal and the strobe signal so as not to deteriorate the duty ratio of a clock signal generated from the data and strobe signals, i.e., to make a duty ratio when either data or strobe signal operates in a cycle of a clock signal, closer to 50%.

The deterioration of the duty ratio derived from the tr/tf difference becomes prominent at high transfer speed. Considering this, too, it is a particularly demanded technique to make the duty ratio closer to 50% in recent years.

Next, a mechanism which causes the tr/tf difference to deteriorate a duty ratio will be described with reference to a circuit shown in FIG. 1A and a timing chart shown in FIG. 1B.

Figure 1A:
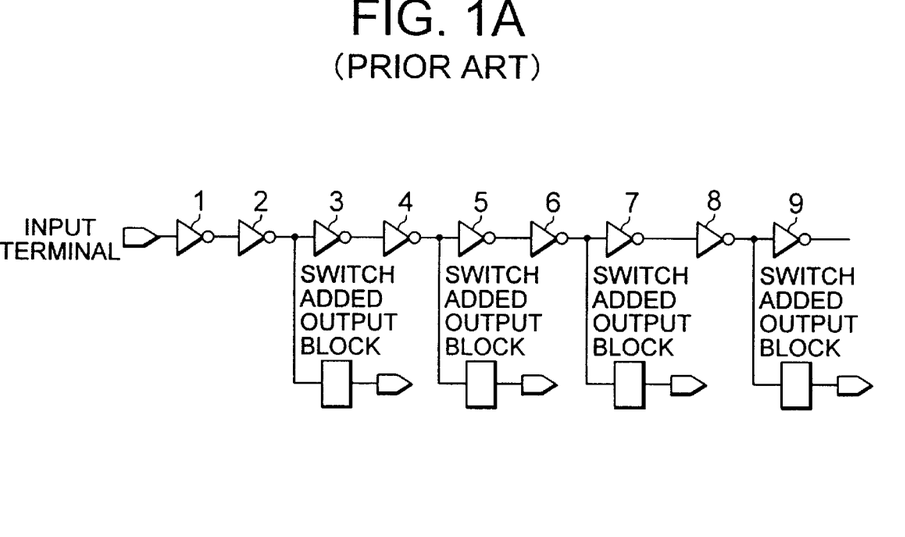
FIG. 1A is a block diagram of a conventional variable delay circuit.
Figure 1B:
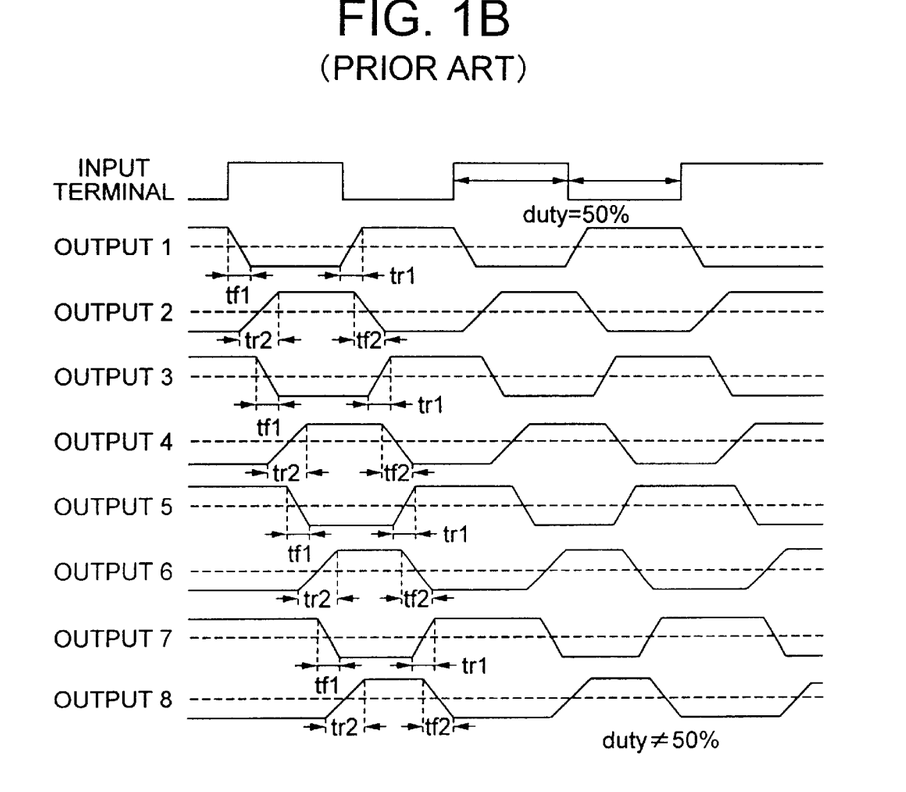
FIG. 1B is a timing chart showing timing waveforms of respective outputs of the circuit shown in FIG. 1A.

Referring to FIG. 1A, this circuit is a variable delay circuit in which inverters are serially connected and the outputs of even stage inverters are connected to the next inverters and switch-added output blocks.

In this variable delay circuit, it is assumed that when a load is one inverter, a rising time tr1 and a falling time tf1 satisfies the relationship of tr1=tf1, and when a load is an inverter and output block, a rising time tr2 and a falling time tf2 satisfies the relationship of tr2>tf2.

When a signal having a duty ratio of 50% is inputted to an input terminal, it is found that as the number of stages is increased, the distance between the rising edge and the falling edge tends to be narrowed and the duty ratio deteriorates in the circuit connection in which the even stage inverters have higher loads.

In order to meet the demand of preventing the deterioration of a duty ratio, for example, Japanese Patent Application Laid-Open (JP-A) No. 8-335861 has proposed a variable delay circuit having a circuit arrangement in which a plurality of identical inverters are serially connected and even stage inverters are connected to switch-added output blocks, respectively, characterized in that dummy load capacities (load circuits) are connected to the odd stage inverters (inverting buffers) and that the differences in driven capacity between odd stage inverters and the even stage inverters for the purpose of reducing the duty deterioration of output signals.

Figure 2:
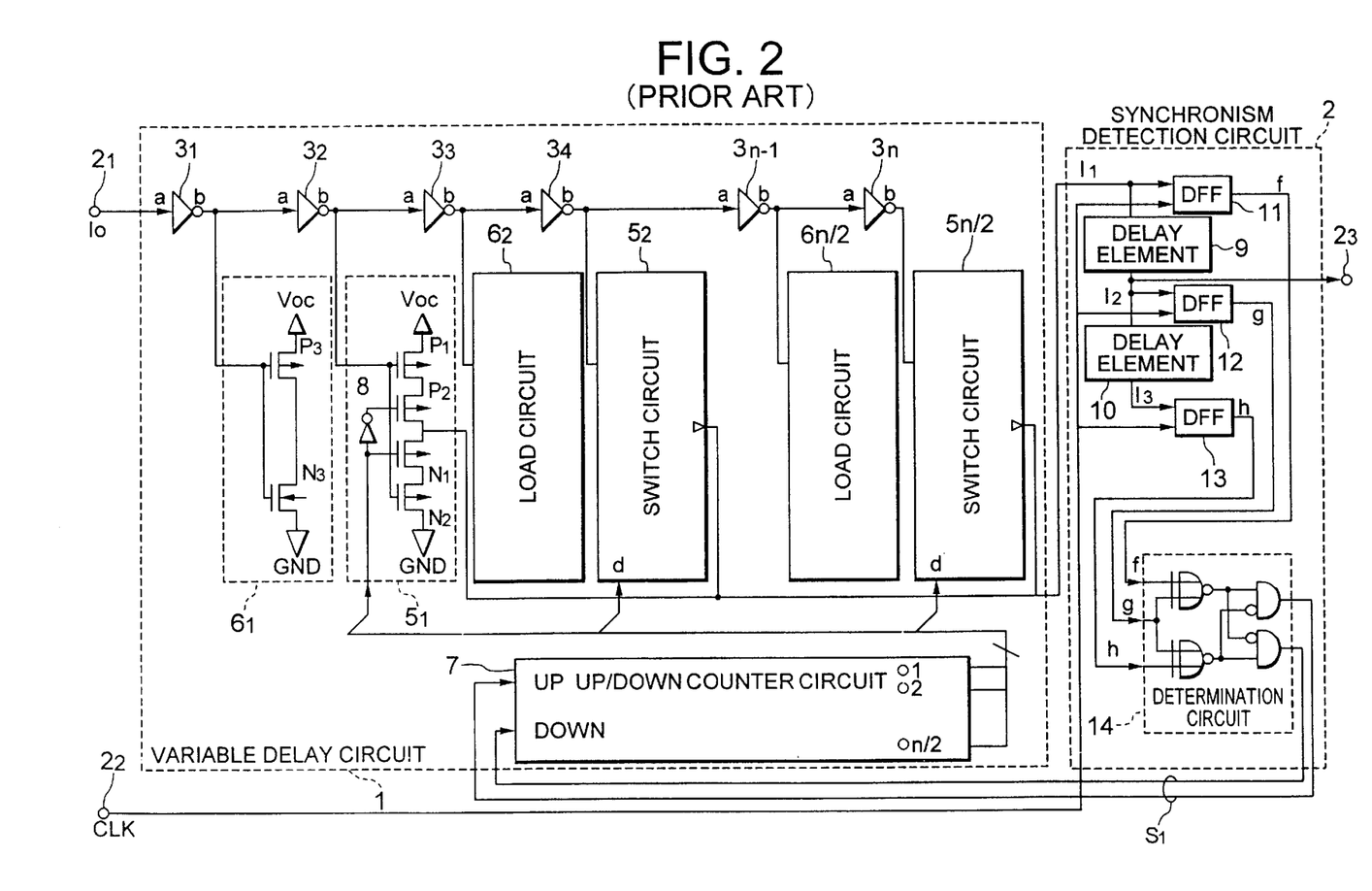
FIG. 2 is a block diagram of a variable delay circuit disclosed by Japanese Patent Application Laid-Open (JP-A) No. 8-335861.

According to the technique disclosed in the above publication, as shown in FIG. 2, the capacities of the gates driven by the inverters are equal and duty deterioration derived form the difference in driven gate capacity is prevented. That is, the variable delay circuit 1 includes inverting buffers $3_1, \ldots, 3_n$ from the first to the n-th stages (where n is an even number) connected in series, switch circuits $5_1, \ldots, 5_{n/2}$ connected to output terminals b of the even numbered inverting buffers $3_2, 3_4, \ldots, 3_n$, respectively, an up/down counter circuit 7 for selecting one of the switch circuits $5_1, \ldots, 5_{n/2}$ and for outputting a signal I1 from the selected switch circuit and load circuits $6_1, \ldots, 6_{n/2}$ connected to output terminals b of the odd numbered inverting buffers $3_1, 3_3, \ldots, 3_{n-1}$ of the inverting buffers, and having equivalent loads to those of the switch circuits $5_1, \ldots, 5_{n/2}$.

The circuit arrangement described in the above publication, however, has a problem that the difference in wiring capacity is generated depending on the difference in wiring length between blocks and the difference between adjacent wirings and crossed wirings and duty thereby deteriorates.

Furthermore, there are many cases where actual circuits, which functions are complicated and on which test modes are mounted, require an antangenient in which different blocks are mixed and circuit branches exist. With such a circuit arrangement, there is no avoiding the occurrence of the difference between a rising time (tr) and falling time (tf) depending on the combinations of driving capabilities and loads of the respective blocks. It is not, therefore, practical to prepare load adjustment blocks which satisfy all the combinations and to design a circuit.

Owing to this, it is difficult to prevent duty deterioration derived from wiring capacities even with a simple circuit in which identical blocks are serially connected, or particularly difficult with a circuit having different blocks and including branches.

This problem will be described in detail while taking the following cases as examples.

Figure 3A:
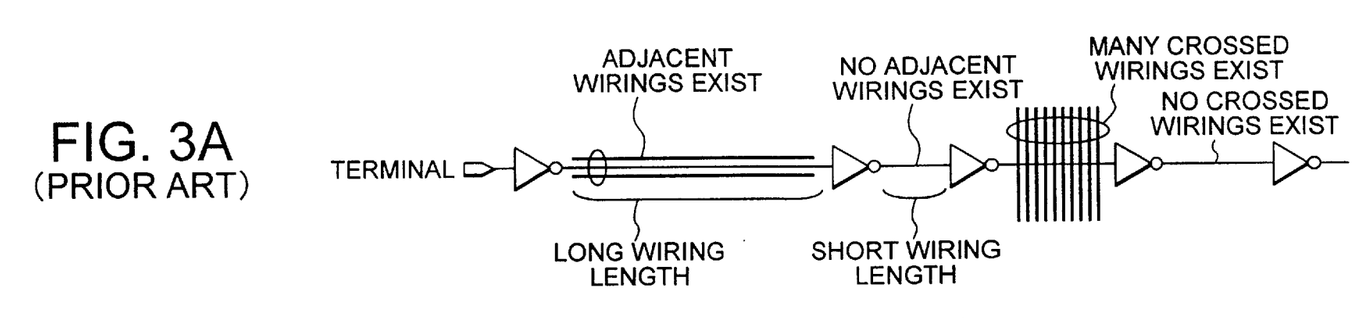
FIGS. 3A, 3B and 3C are views for describing conventional disadvantages.

The first example, i.e., an example of a circuit arrangement in which identical circuit blocks (e.g., inverters) are serially connected, is shown in FIG. 3A.

Duty deteriorates because of the difference in wiring capacity caused by the difference in wiring length among inverters and difference between crossed wirings and adjacent wirings.

Figure 3B:
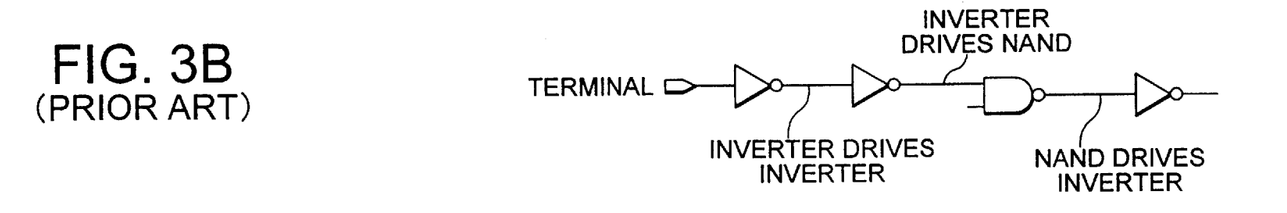

The second example, i.e., an example of a circuit arrangement in which different circuits blocks (inverters and NAND circuits in this example) are serially connected, is shown in FIG. 3B. Duty deteriorates because of the differences in driving capability and input capacity among circuit blocks as well as that in wiring capacity as in the case of the first example.

Figure 3C:
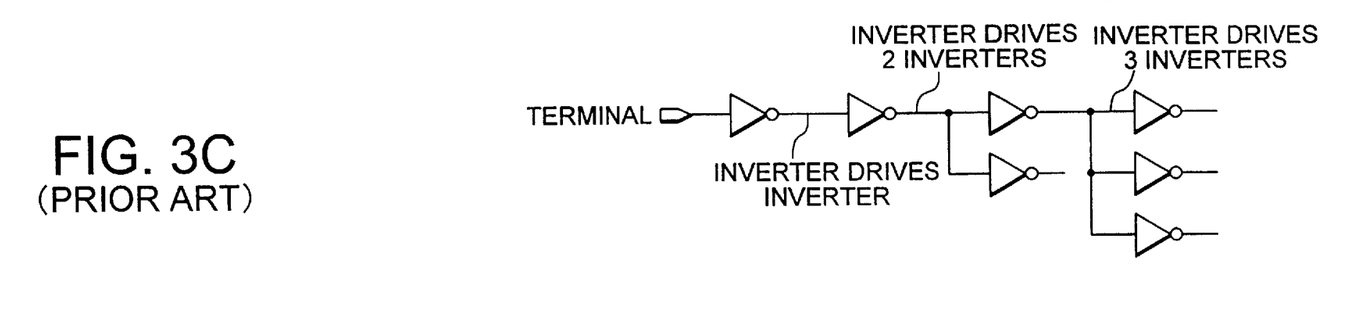

The third example, i.e., an example of a circuit arrangement having connection branches, is shown in FIG. 3C. Duty deteriorates because of the difference in input capacity among circuit blocks and that in wiring capacity as in the case of the first example.

In an actually used semiconductor integrated circuit, the above-stated first to third examples are mixed, thereby making it more difficult to prevent duty deterioration.

SUMMARY OF THE INVENTION

It is an object of the present invention to provide a semiconductor integrated circuit and a duty deterioration preventing method capable of preventing duty deterioration derived from the differences in wiring capacity, block driving capability and loads by using a simple circuit arrangement.

A method of preventing duty deterioration of a semiconductor integrated circuit according to the present invention is characterized in that the semiconductor integrated circuit includes a first circuit and a second circuit, which have the same combination of driving capability and driving capacity, and an inversion logic circuit inserted between the first circuit and the second circuit.

Then, the difference between a rising time and a falling time of a signal generated in each circuit block of the first circuit is canceled by the difference between a rising time and a falling time of a signal generated in a corresponding circuit block of the second circuit, thereby preventing duty deterioration derived from circuit block arrangement, branching and wiring capacity.

Another method of preventing duty deterioration of a semiconductor integrated circuit according to the present invention is characterized in that the semiconductor integrated circuit includes an inversion logic circuit inserted between a first circuit and a second circuit having a same circuit arrangement as an arrangement of said first circuit.

In the design steps of the first and second circuits, for example, when the same mask pattern cannot be used for the first and second circuits, mask patterns having the same conditions for wiring length, crossed wirings and adjacent wirings are used.

A semiconductor integrated circuit according to one aspect of the invention, is characterized in that a first circuit and a second circuit are connected to each other through an inversion logic circuit, the second circuit having the same circuit arrangement and the same layout as those of the first circuit.

A semiconductor integrated circuit according to another aspect of the invention characterized by comprising an inversion logic circuit provided between a first circuit and a second circuit having the same circuit arrangement as that of the first circuit, the first and the second circuits being connected in a cascaded manner. This semiconductor integrated circuit is constructed such that the difference between a rising time and a falling time of a signal generated in each circuit block of the first circuit is canceled by the difference between a rising time and a falling time of a signal generated in a corresponding circuit block of the second circuit.

A semiconductor integrated circuit according to still another aspect of the invention is characterized by comprising an inverse logic circuit provided between a first circuit and a second circuit which are connected in a cascaded manner, in which the first circuit and the second circuits are constructed to have the same combination of driving capability and driving capacity.

A semiconductor integrated circuit according to another aspect of the invention is characterized by comprising a first circuit driven by a reference driving circuit; and a second circuit driven by an inversion reference driving circuit inputting an output of the first circuit, in which the first circuit and the second circuit have substantially the same circuit arrangement and have the same combination of driving capability and driving capacity.

In this case, if the first circuit and the second circuit differ in circuit blocks and the number of different circuit blocks is odd, then one circuit block is used as a dummy element. When the number of the different circuit blocks is even, no circuit block is used as a dummy element.

In addition, in an overall circuit formed by combining the first circuit and the second circuit, when one branch is necessary, an unnecessary circuit block after branching in the second circuit is used as a dummy element. When two branches are necessary, no dummy element is necessary.

According to the present invention, the same circuits and mask patterns having the same combination of driving capability and driving capacity and having logic's inverted from each other are connected to each other. Due to this, all the differences between rising time (tr) and falling time (tf) can be advantageously canceled. Also, because of no duty deterioration, a signal can be advantageously transmitted at high transfer speed. Further, duty deterioration can be advantageously prevented without any influence of process variation.

Moreover, in addition to the above advantages, the present invention has the following advantages. As the first advantage, duty deterioration can be prevented even with circuit connection including different wiring lengths and crossed and adjacent wirings. As the second advantage, duty deterioration can be prevented even with circuit connection in which different blocks are mixed. As the third advantage, duty deterioration can be prevented even with circuit connection including branches. Needless to say, deterioration can be prevented even with circuit connection including the above three items.

DESCRIPTION OF THE PREFERRED EMBODIMENTS

The present invention is constructed by connecting the first circuit to the second circuit having the same circuit arrangement and layout as those of the first circuit through an inverting logic circuit.

Figure 4:
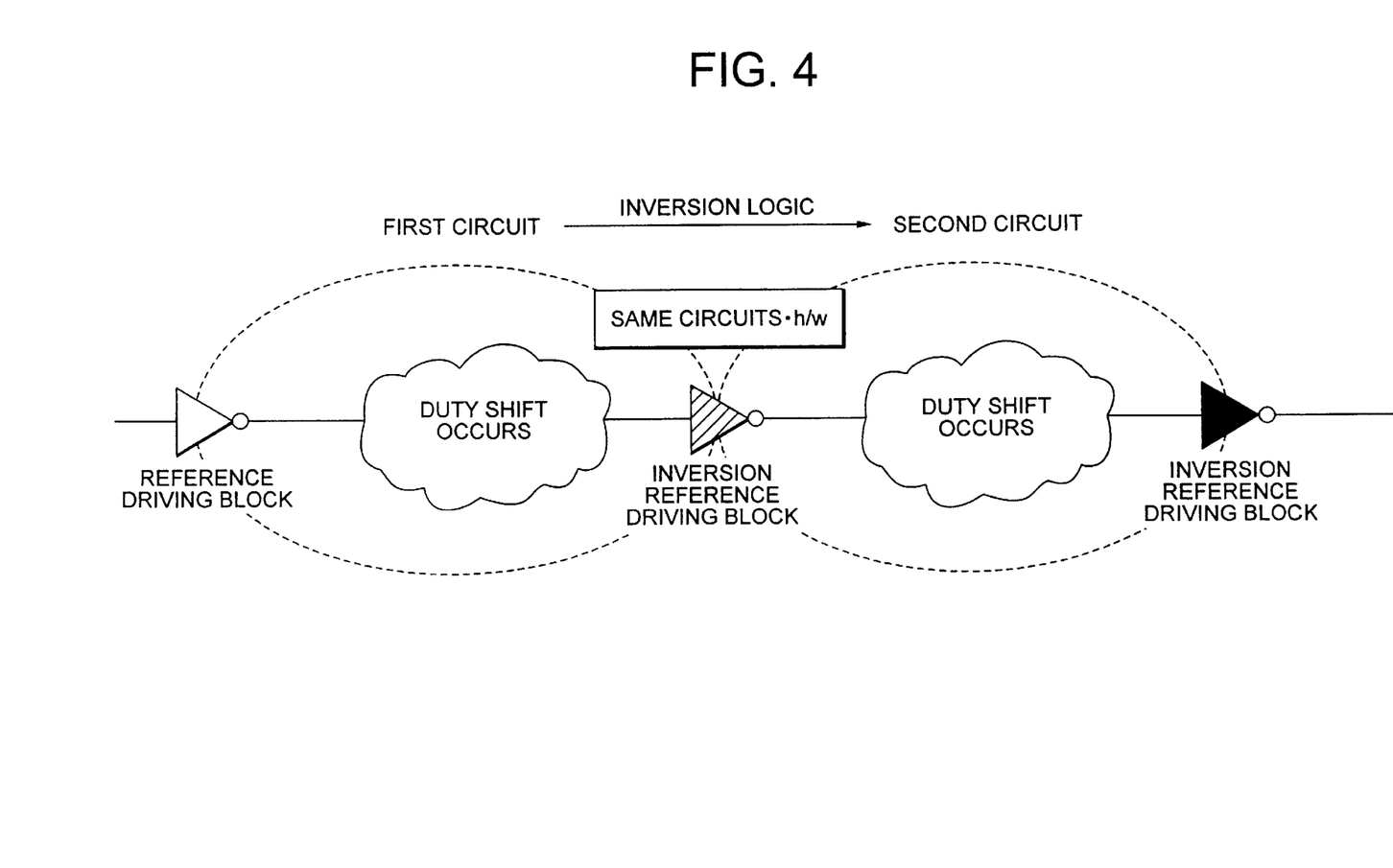
FIG. 4 is a circuit connection view showing the basic arrangement of the present invention.

FIG. 4 is a typical view showing the basic arrangement of the first invention. The present invention is designed to cancel the difference between a rising time (tr) and a falling time (tf) which difference inevitably occurs in the connection having different wiring lengths or having different crossed wirings and adjacent wirings or that having different blocks mixed therein and that having branches by using same circuits having inverted logic's.

While the circuit connection in which signal duty is shifted is assumed as the first circuit and, the first circuit and the second circuit same as the first circuit are connected to each other through an inversion logic block (inverter in FIG. 1), thereby making it possible to cancel the difference in a rising time (tr) and a falling time (tf) of a signal generated in the first circuit by the difference between a rising time (tr) and a falling time (tf) of a signal generated in the second circuit having an inversion logic and driving the same capacity as that of the first circuit.

The inversion block (e.g., inverter circuit) connected between the first circuit and the second circuit same as a circuit block which conducts first intended buffering and cancels the capacity difference between the first and second circuits after signal inversion.

The final circuit block in the second circuit may be different from other blocks as long as the final block has the same input capacity as that of the inversion block.

According to the present invention, it is preferable that not only the same circuits are used but also the mask pattern of the first circuit is same as that of the second circuits.

As for adjacent wirings, measures to prevent wirings from surrounding circuits including, for example, provision of a wiring prohibition region at a position at which adjacent wiring is desired to be prevented on the mask pattern of the first circuit or provision of a dummy wiring, are taken. Since the second mask pattern to be used is same as the mask pattern of the first circuit, the same measures to prohibit adjacent wirings are taken for the second circuit.

As for crossed wirings, crossed wiring channel are provided in advance and unused channels are not used as dummy wirings.

However, if the same mask pattern cannot be used for the first circuit and the second circuit due to arrangement conditions, areas and the like, mask patterns having the same conditions for wiring length, crossed wirings and adjacent wirings are designed.

If there are the even number of different blocks or that of same branches, no dummy element is necessary. If there are the odd number of different blocks or that of same branches, it suffices to add only one dummy element.

Figure 5:
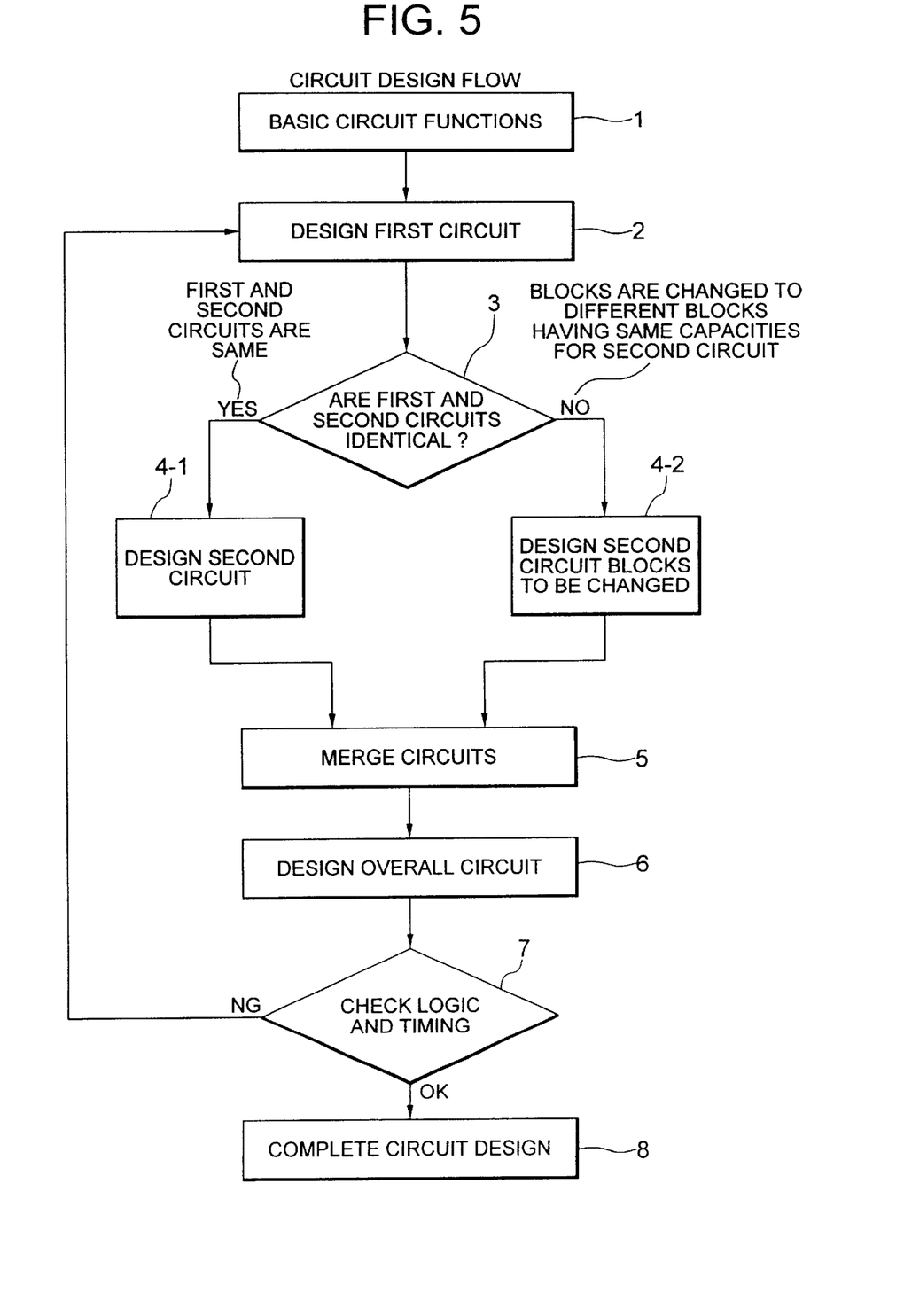
FIG. 5 is a flow chart for describing a circuit design flow according to the present invention.
Figure 6:
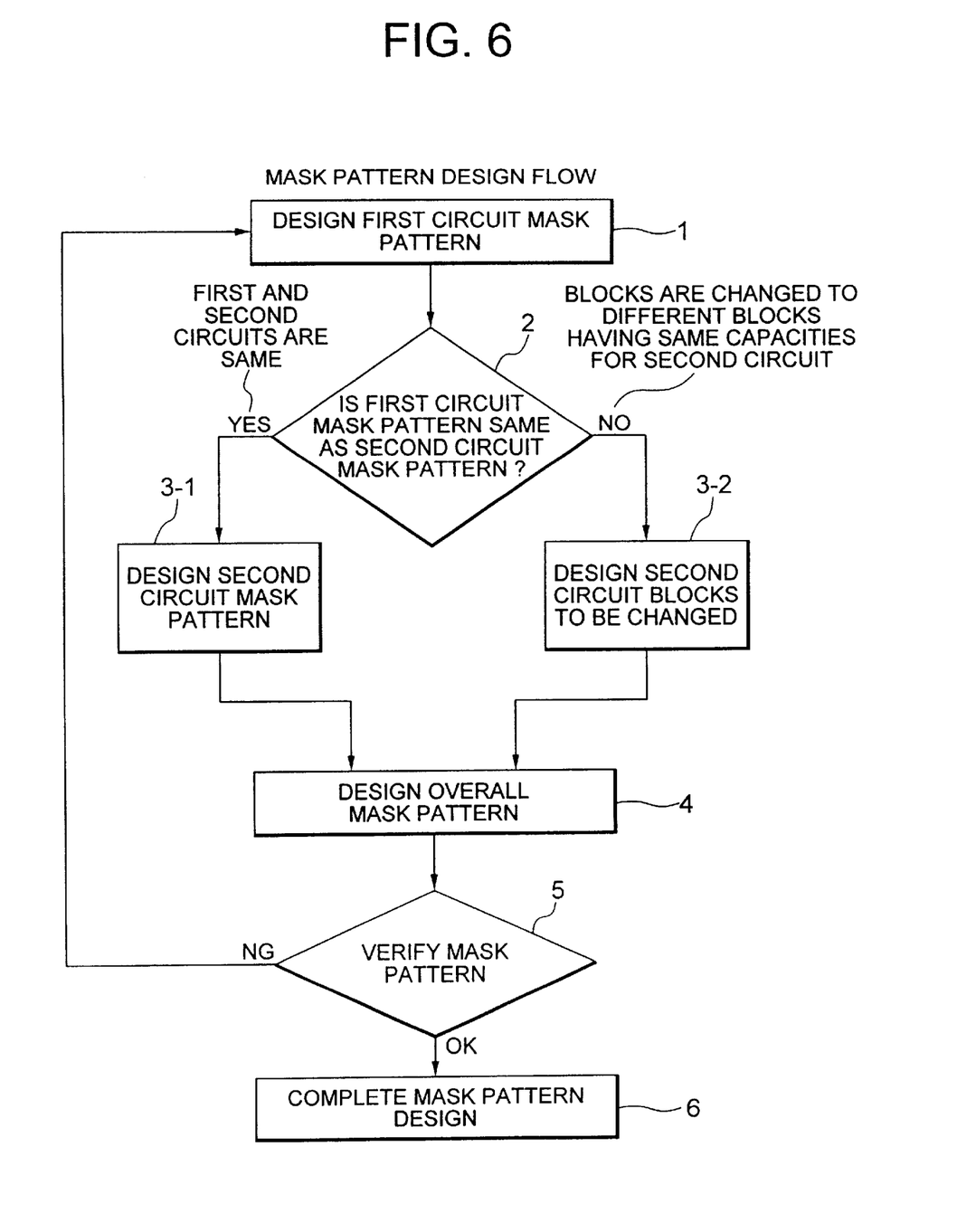
FIG. 6 is a flow chart for describing mask pattern design steps according to the present invention.

FIGS. 5 and 6 are flow charts showing the flow of circuit design steps and that of mask pattern design steps in one embodiment according to the present invention.

First, description will be given to the circuit design flow with reference to FIG. 5.

(1) Basic circuit function:

Functions necessary for a circuit to be designed are checked. Types and the number of blocks and branches to be used are inquired and the simplest circuit for which the technique of the present invention is not utilized, is designed.

(2) Design of the first circuit:

An overall circuit to be designed is realized with an arrangement in which two same circuits are connected to each other by inversion logic. The first circuit is designed so that the overall circuit having the functions checked in the step (1) can be realized by the technique of the present invention. Namely, the first circuit is designed so that the overall circuit logic can be realized if the first circuit is connected to a circuit having a logic inverted from that of the first circuit and same as the first circuit.

(3) It is determined whether or not the first and second circuits are same.

(4-1) Design of the second circuit:

If the second circuit is same as the first circuit, the first circuit is used as the second circuit.

(4-2) Design of the second circuit blocks to be changed:

If the second circuit is not same as the first circuit and it is advantageous to change blocks of the first circuit to different blocks having the same input capacity and driving capability in view of the circuit arrangement, power consumption, area and the like, then the blocks are changed for the second circuit. If blocks are changed, it should be taken into account that the driving capability and load of the second circuit are the same as those of the first circuit in a path for preventing duty deterioration.

(5) Circuit merger:

The respective circuits designed in the steps (4-1) and (4-2) are merged into an overall circuit.

(6) Design of the overall circuit:

In the overall circuit, if it is possible to reduce dummy elements by changing part of logic's, the circuit design is changed. In this case, too, it should be taken into account that the driving capability and load of the first circuit are the same as those of the second circuit in a path for preventing duty deterioration.

(7) Check logic's and timing:

It is checked whether or not the logic of the circuit signed in the step (6) is coincident with that checked in the step (1).

It is also checked whether duty deterioration can be prevented by conducting, for example, a simulation of the overall circuit.

If any problems are found, the circuit design is started over again from the step (2).

(8) Completion of the circuit design:

If no problems are found as a result of the step (7), the circuit design is completed.

Next, the mask pattern design flow will be described with reference to FIG. 6.

(1) Design of the first circuit mask pattern:

A mask pattern for the first circuit is designed. Crossed wiring channels are provided while considering surrounding circuits. A prohibition range in which adjacent wirings are prevented or a dummy wiring is provided.

(2) It is determined whether or not the mask pattern of the first circuit is the same as that of the second circuit.

(3) Design of the second circuit mask pattern:

If the first and second circuits are the same and the same mask pattern can be used, the mask pattern of the first circuit is used for the second circuit.

If the first and second circuits are the same but the same mask pattern cannot be used for the overall arrangement region, area and the like, then the mask pattern of the second circuit is designed so as to have the same conditions for wiring length, crossed wirings and an adjacent wiring prohibition region as those of the first circuit mask pattern.

(3-2) Design of the second circuit blocks to be changed:

If the second circuit partly differs from the first circuit and the mask pattern of the second circuit is the same as that of the first circuit in most parts, then the mask pattern for the first circuit is used for that of the second circuit, only blocks needed to be changed are replaced, and wirings are provided.

If the second circuit partly differs from the first circuit and the same mask pattern as that of the first circuit cannot be used for overall arrangement regions, areas and the like, then the mask pattern of the second circuit is designed so as to have the same conditions for wiring length, crossed wirings and adjacent wiring prohibition as those for the mask pattern of the first circuit.

(4) Design of an overall mask pattern:

The mask patterns of the first and second circuits are merged into the mask pattern of an overall circuit. If positions of input and output terminals need to be adjusted, they are carefully corrected so that conditions for wiring length, crossed wirings and adjacent wiring prohibition are the same between the first and second circuits.

(5) Verification of the mask pattern:

It is verified whether the mask pattern designed in the step (4) is coincident with the overall circuit. It is also verified whether conditions for wiring length, crossed wrings and adjacent wiring prohibition are the same between the first and second circuits. If any problems are found, patterns are redesigned back to the step (1).

(6) Completion of mask pattern design:

If no problems are found in the verification step (5), the design of mask patterns is completed. The present invention will be described in detail hereinafter in accordance with specific embodiments.

Figure 7:
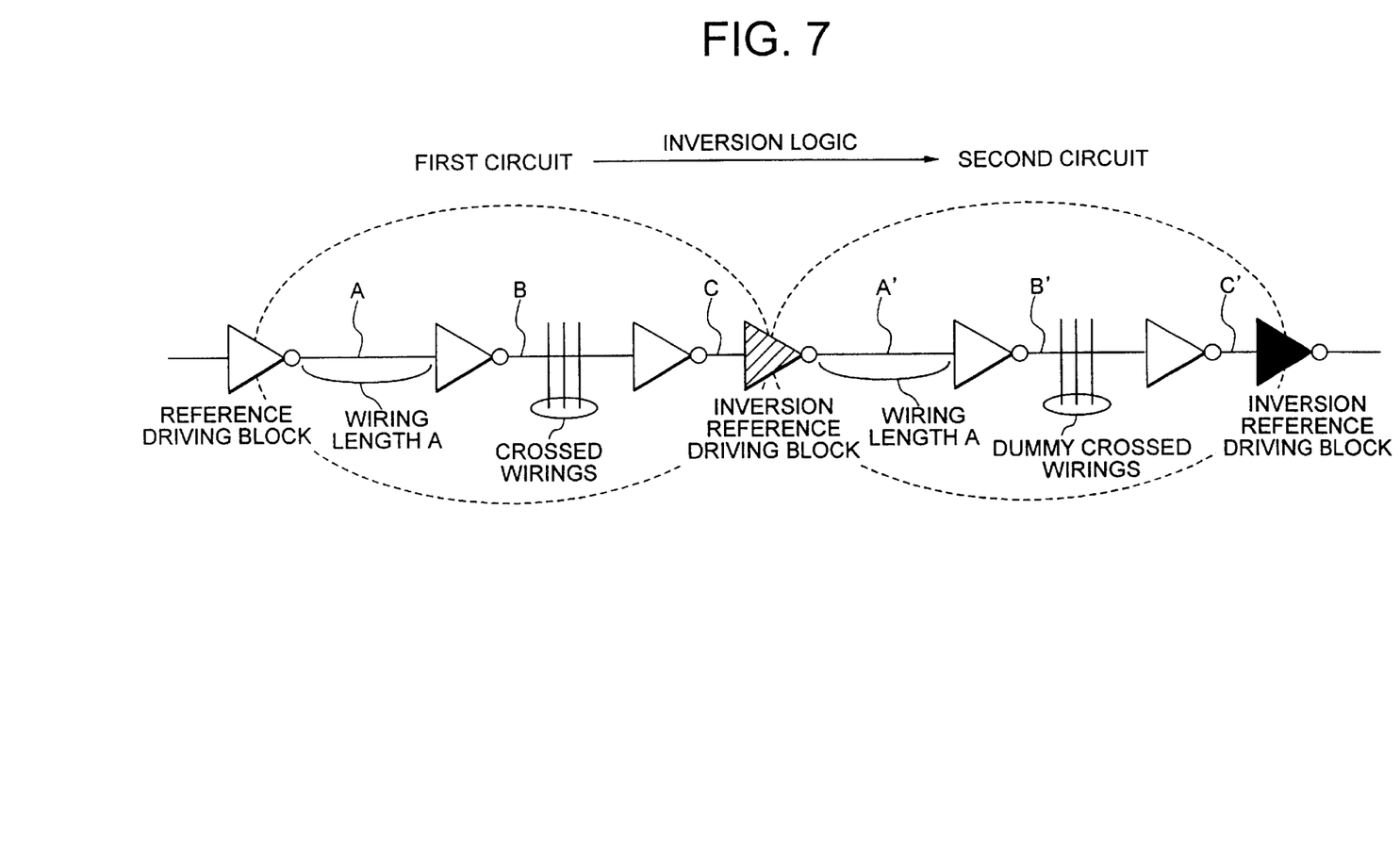
FIG. 7 is a circuit diagram showing the first embodiment according to the present invention.

Next, preferred embodiments of the present invention will be described. FIG. 7 is an explanatory view for the first embodiment according to the present invention.

The first embodiment concerns an arrangement in which identical blocks (inverters) are serially connected. In the first circuit, a reference driving block drives a wiring A and the next inverter. Following them, a wiring B and a wiring C and an inverter are connected. The wiring A of the first circuit is longer than the wirings B and C and the wiring B includes crossed wirings.

The second circuit is connected to the first circuit through an inversion reference driving block.

The second circuit and its layout are the same as the first circuit and its layout. The wirings of the second circuit corresponding to those of the first circuit are wirings A', B' and C', respectively.

Next, comparison will be made to the driving capabilities and loads of the respective blocks in the first and second circuits as follows.

[First circuit]
  A: Reference driving block drives wiring length A+inverter.
  B: Inverter drives wiring length B+inverter+crossed wiring capacity.
  C: Inverter drives wiring length C+reference driving block.

[Second circuit]
  A': Inversion reference driving block drives wiring length A'+inverter.
  B': Inverter drives wiring length B'+inverter+crossed wiring capacity.
  C': Inverter drives wiring length C'+inversion reference driving block.

The first and second circuits are entirely coincident with each other in combinations of driving capabilities and loads, and the logic of the first circuit is inverted from that of the second circuit. Thus, even if there is a difference between the first and second circuits in wiring length and crossed wirings, the difference between a rising time (tr) and a falling time (tf) in the first circuit is entirely canceled by the difference between a rising time (tr) and a falling time (tf) in the second circuit.

It is noted that it is not necessary to use all of the dummy crossed-wiring channels provided in the second circuit.

Figure 8:
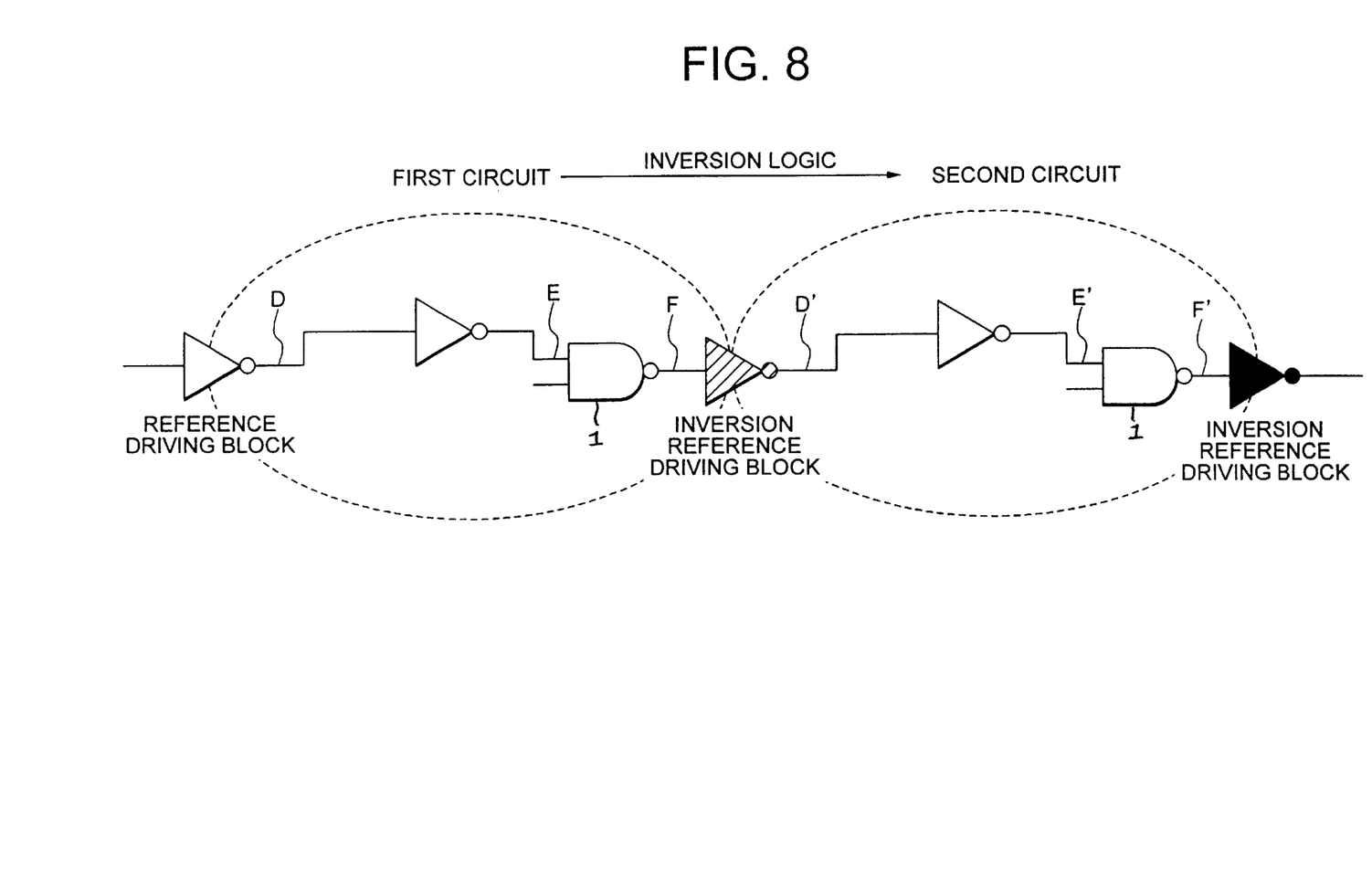
FIG. 8 is a circuit diagram showing the second embodiment according to the present invention.

Next, the second embodiment according to the present invention will be described. FIG. 8 shows the second embodiment of the present invention. The second embodiment concerns an arrangement in which different blocks (inverters and NANDS in this embodiment) are serially connected. In the first circuit, a reference driving block drives a wiring D and the next inverter. Then, the inverter drives a wiring E and an NAND, and the NAND drives a wiring F and an inversion reference driving block.

The second circuit is connected to the first circuit through the inversion reference driving block.

The second circuit and its layout are the same as the first circuit and its layout and the wirings of the second circuit corresponding to those in the first circuit are wirings D', E' and F', respectively.

Next, comparison will be made to the driving capabilities and loads of the respective blocks in the first and second circuits as follows.

[First circuit]:
  D: Reference driving block drives wiring length D+inverter.
  E: Inverter drives wiring length E+NAND input terminal 1.
  F: NAND drives wiring length F+reference driving block.

[Second circuit]
  D': Inverse reference driving block drives wiring length D'+inverter.
  E': Inverter drives wiring length E'+NAND input terminal 1.
  F': NAND drives wiring length F'+inversion reference driving block.

The first and second circuits are entirely coincident with each other in combinations of driving capabilities and driving capacities and the logic of the first circuit is inverted from that of the second circuit. Thus, even if there exist different blocks in the first and second circuits, the tr/tf difference in the first circuit is canceled by the tr/tf difference in the second circuit.

Figure 9A:
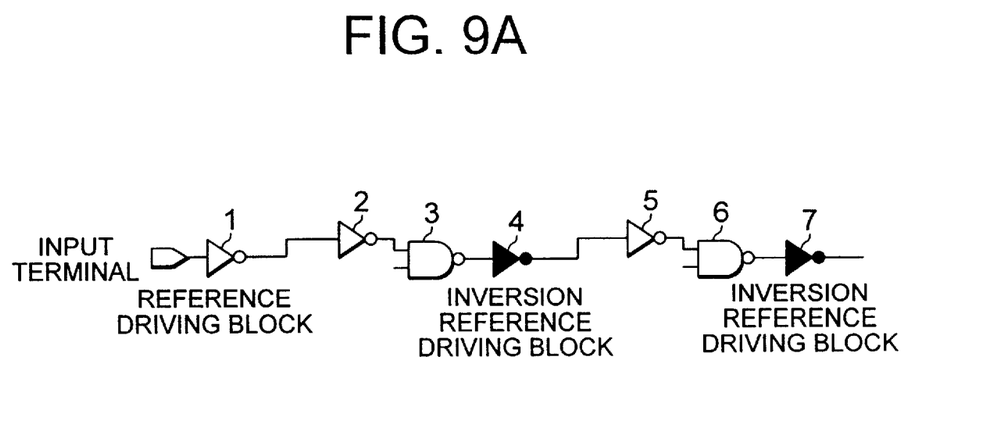
FIG. 9A is a circuit arrangement showing the second embodiment according to the present invention and FIG. 9B is a timing chart showing timing waveforms of the respective outputs of the circuit shown in FIG. 9A.
Figure 9B:
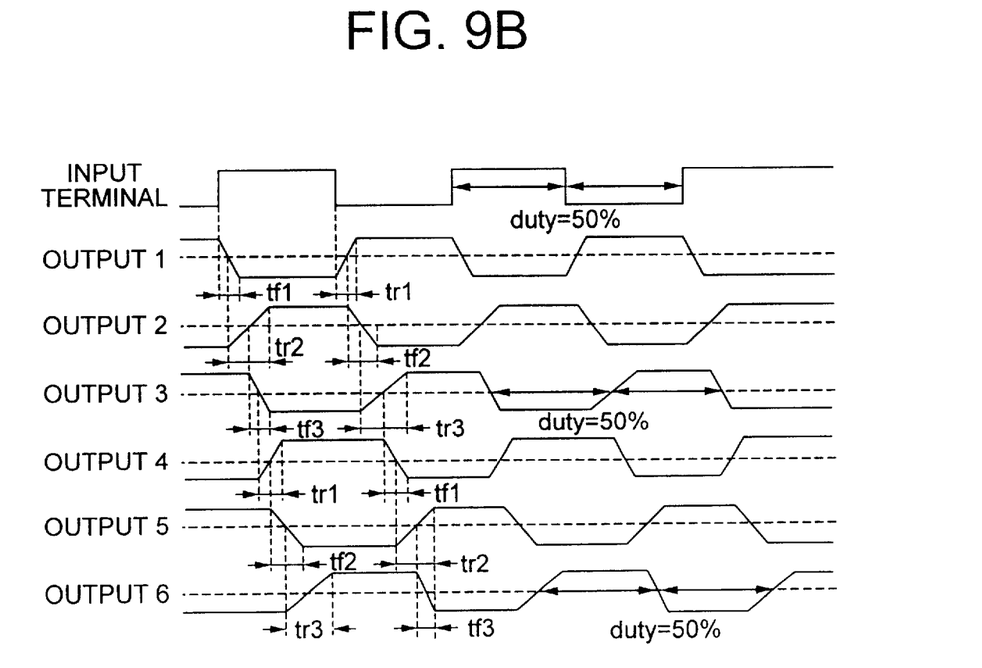

FIG. 9B is a timing chart showing timing operations for outputs (output 1 to output 6) of the respective circuit blocks (gates) 1 to 6 in FIG. 9A.

In FIG. 9B, if the following relationships are satisfied:
  tr1=tf1, where tr1 is a rising time and tf1 is a falling time while a driver is the inverter and a load is the inverter;

tr2>tf2, where tr2 is a rising time and tf2 is a falling time while a driver is an inverter and a load is an NAND; and tr3>tf3 (and tr3−tf3≠tr2−tf2), where tr3 is a rising time and tf3 is a falling time while a driver is the NAND and a load is an inverter, then duty is 50% at the input terminal and the outputs 1, 2 and 3 differ in driving capability and driving capacity, so that duty deteriorates at the outputs 1, 2 and 3.

At the output 3, the distance between the rising edge and the falling edge increases.

Compared with the outputs 1, 2 and 3, the outputs 4, 5 and 6 have the same driving capability and driving capacity. Since the logic's of the outputs 4, 5 and 6 are inverted from those of the outputs 1, 2 and 3, the tr/tf differences among the outputs 1, 2 and 3 are canceled by the tr/tf differences among the outputs 4, 5 and 6. Owing to this, duty at the outputs (six outputs) of the NAND circuit 6 becomes 50%.

In the overall circuit which combines the first and second circuits, if one NAND is required, the input terminal 2 of the NAND of the second circuit is clamped to a power supply potential VDD level and used as a dummy element. If two NANDs are required, no dummy element is necessary. For the same reason, if a circuit includes different circuit blocks and the number of different circuit blocks is odd, the number of circuit blocks used as dummy elements is one and if the number thereof is even, no circuit block used as a dummy element is necessary. Thus, it is possible to prevent the number of dummy elements from increasing.

Figure 10:
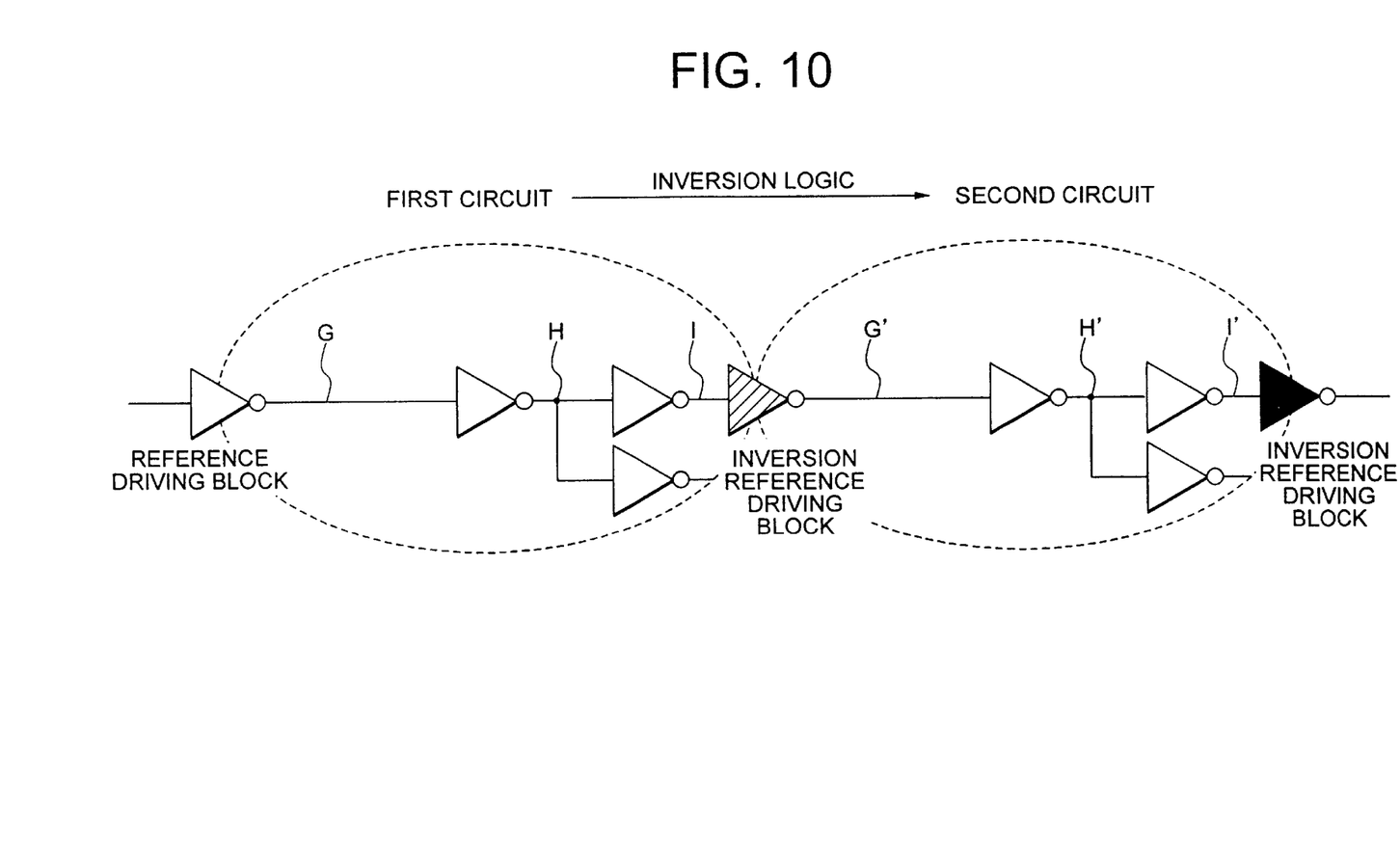
FIG. 10 is a circuit diagram showing the third embodiment according to the present invention.

Next, the third embodiment according to the present invention will be described. FIG. 10 is a block diagram of the third embodiment according to the present invention. The third embodiment concerns an arrangement in which connection is branched off.

In the first circuit, a reference driving block drives a wiring G and the next inverter, the next inverter drives a wiring H and two inverters and the final inverter drives a wiring I and an inversion reference driving block.

The second circuit is connected to the first circuit through the inversion reference driving block. The second circuit and its layout are the same as the first circuit and its layout. The wirings of the second circuit corresponding to those of the first circuit are G', H' and I', respectively.

Next, comparison will be made to the driving capabilities and loads of the respective blocks in the first and second circuits as follows.

[First circuit]

G: Reference driving block drives wiring length G+inverter.

H: Inverter drives wiring length H+two inverters.

I: Inverter drives wiring length I+inversion reference driving block.

[Second circuit]

G': Inversion reference driving block drives wiring length G'+inverter.

H': Inverter drives wiring length H'+two inverters.

I': Inverter drives wiring length I'+inversion reference driving block.

The first and second circuits are entirely coincident with each other in combinations of driving capabilities and driving capacities and the logic of the first circuit is inverted from that of the second circuit. Thus, the difference between a rising time (tr)/a falling time (tf) in the first circuit are canceled by the difference between a rising time (tr) and a falling time (tf) in the second circuit.

In the overall circuit which combines the first and second circuits, if one branch is necessary, an unnecessary inverter of the second circuit after branching is used as a dummy element. In this case, an NAND or the like having the same input capacity as that of the inverter is used and the other input of the NAND is clamped to a GND, thereby making it possible to prevent the dummy element from consuming power.

When two branches are necessary, no dummy element is necessary. When a block having the same input capacity as that of the inverter of the second circuit after branching is used, it is not necessary to use an inverter.

Figure 11A:
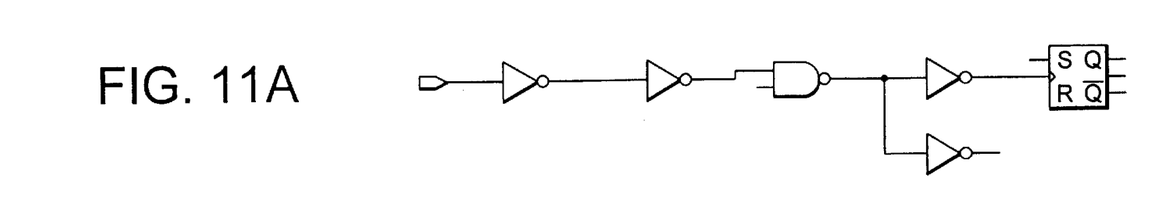
FIGS. 11A, 11B and 11C are circuit diagrams showing the fourth embodiment according to the present invention.

Next, the fourth embodiment according to the present invention will be described. The fourth embodiment concerns an arrangement in which there is a branch using an inverter and an NAND and shows a circuit for supplying a clock signal which retains duty to a flip-flop (F/F).

Figure 11B:
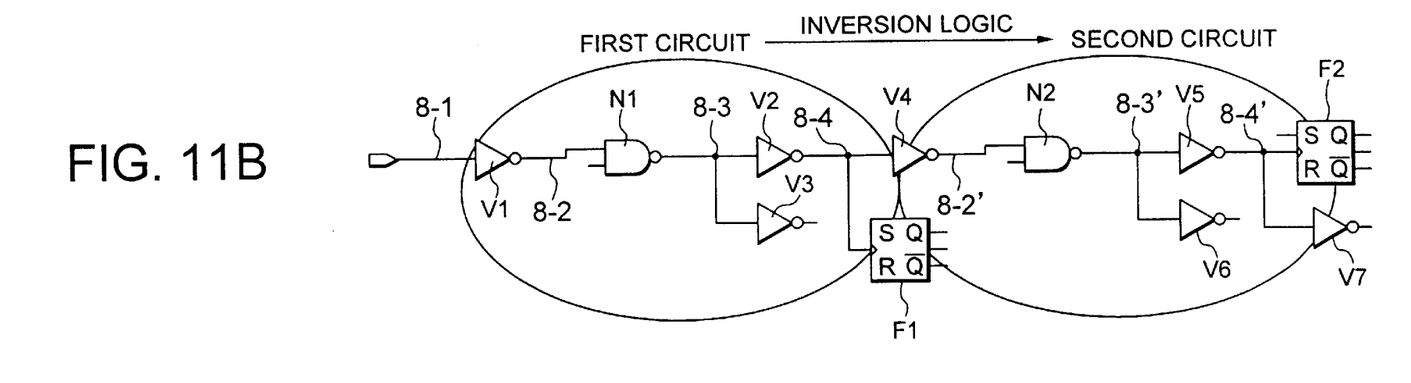

FIG. 11A is a block diagram of the fourth embodiment according to the present invention. Procedures for changing a circuit arrangement to that in which the first and second circuits are connected by inversion logic will be described below. The overall circuit in which the first and second circuits are thus connected is shown in FIG. 11B.

Circuit elements V1, N1, V2 and V3 used as references are determined.

A flip-flop (F/F) F1 and an inverter V7 are connected to wiring 8-4 and 8-4', respectively so that the load of an inverter V5 for driving a final-stage flip flop F2 is equal to that of an inverter V2.

Blocks V1, N1, V2 and V3, which are constituent elements of the first circuit, are connected to blocks V4, N2, V5 and V6 which are constituent elements of the second circuit while a block inverting inverter V4 is put at the center of the first and second circuits.

The blocks V3, V7 and F1 become dummy elements and can be replaced by other blocks having the same input capacities, respectively.

Figure 11C:
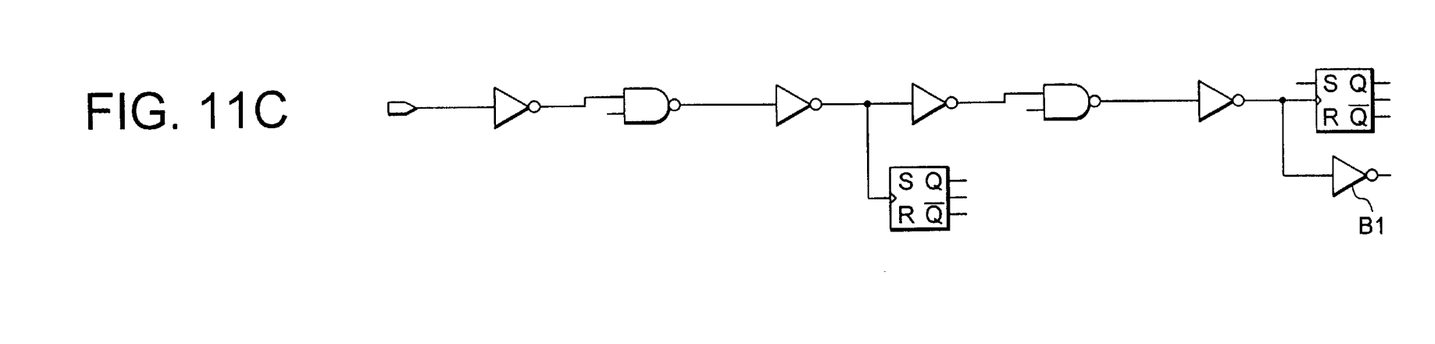

Further, referring to FIG. 11C, the inverter V7 shown in FIG. 11B is replaced by a buffer B1 having the same input capacity as that of the inverter V7, thereby making it possible to dispense with the inverters V3 and V6 shown in FIG. 11B.

In FIG. 11B, the wirings of the second circuit corresponding to the wirings 8-2, 8-3 and 8-4 of the first circuit are 8-2', 8-3' and 8-4', respectively.

Next, comparison will be made to the driving capabilities and loads of the respective blocks in the first and second circuits as follows.

[First circuit]

8-2: Inverter V1 drives wiring 8-2+NAND N1.

8-3: NAND N1 drives wiring 8-3+two inverters V2 and V3.

8-4: Inverter V2 drives wiring 8-4+inverter V4+F/F F1.

[Second Circuit]

8-2': Inverter V4 drives wiring 8-2'+NAND N2.

8-3': NAND N2 drives wiring 8-3'+two inverters V5 and V6.

8-4': Inverter V5 drives wiring 8-4'+inverter V7+F/F F2.

The first and second circuits are entirely coincident with each other in combinations of driving capabilities and driving capacities and the logic of the first circuit is inverted from that of the second circuit. Thus, the tr/tf difference in the first circuit is canceled by that in the second circuit.

Figure 12A:
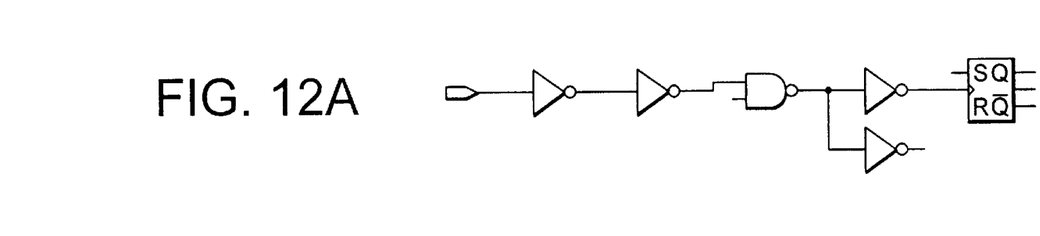
FIGS. 12A, 12B and 12C are circuit arrangements showing the fifth embodiment according to the present invention.

Next, the fifth embodiment according to the present invention will be described. The fifth embodiment is designed to work with a divided circuit arrangement and has the equivalent circuits to those in the fourth embodiment.

Figure 12B:
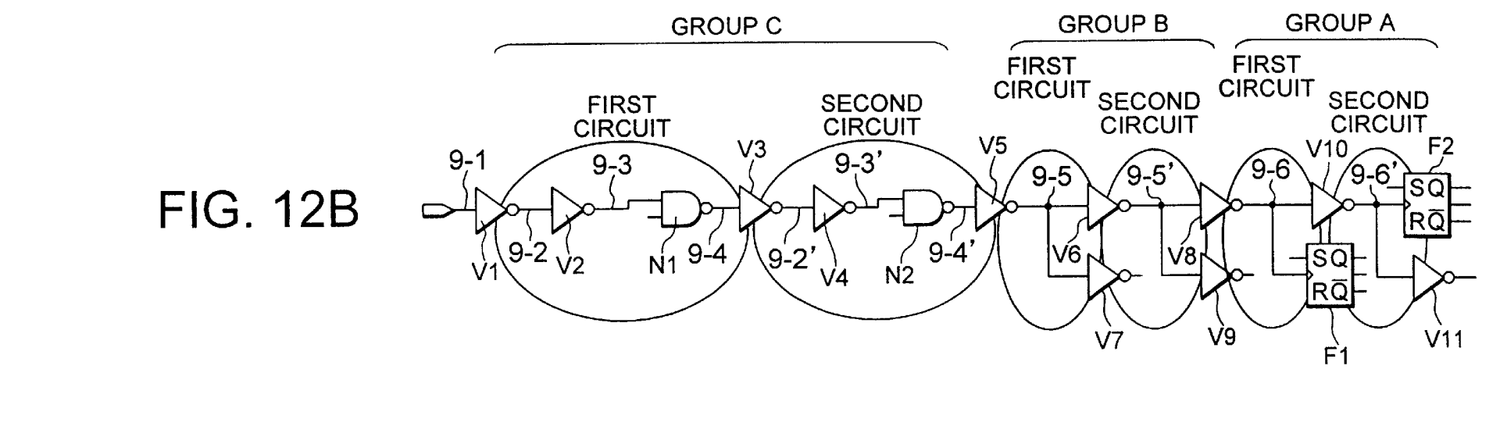

FIG. 12A is a block diagram of the fifth embodiment according to the present invention. Procedures for changing a circuit arrangement to that in which the first circuit is connected to the second circuit by inversion logic in this embodiment are described below and the circuit arrangement in this embodiment is shown in FIG. 12B.

A flip-flop F1 and an inverter V11 are connected to wirings 9-6 and 9-6', respectively so that the load of an inverter V10 for driving a final-stage flip-flop F2 of the second circuit is equal to that of an inverter V8 prior to the inverter 10.

Based on the above connection, the first circuit is constituted by the elements V8, V10 and F1 and the second circuit is constituted by the elements V10, V11 and F2 in a group A.

Inverter V7 and V9 are connected to wirings 9-5 and 9-5', respectively so that the load of an inverter V6 is equal to that of an inverter V5.

Based on the above connection, the first circuit is constituted by the elements V5, V6 and V7 and the second circuit is constituted by the elements V6, V8 and V9 in a group B.

In a group C, the first circuit is constituted by elements V1, V2, N1 and V4 the second circuit is constituted by elements V3, V4, N2 and V5.

The elements V9, V11 and F1 become dummy elements and can be replaced by other blocks having the same input capacities, respectively.

Figure 12C:
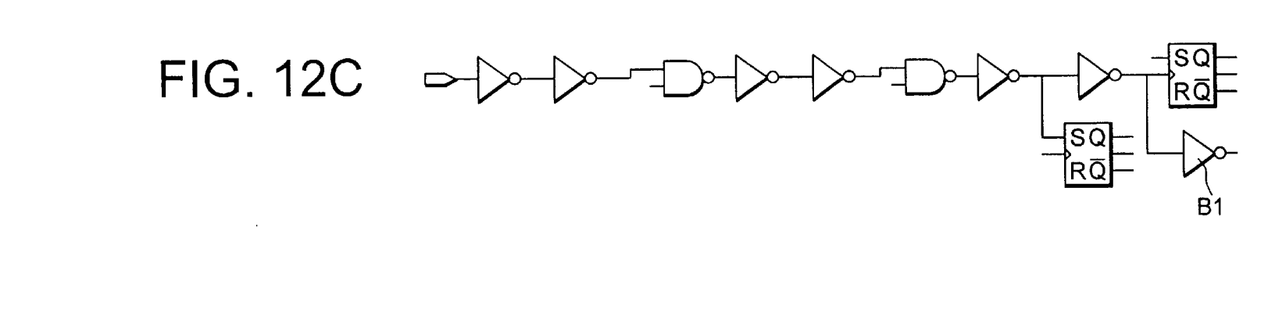

Further, referring to FIG. 12C, the inverter V11 shown in FIG. 12B is replaced by a buffer B1 having the same input capacity as that of the inverter V11, thereby making it possible to dispense with the elements V6, V7, V8 and V9 shown in FIG. 12B.

In FIG. 12B, the wirings of the second circuit in each group corresponding to those of the first circuit in the same group are as follows:

Group A: 9-6'

Group B: 9-5'

Group C: 9-2', 9-3', 9-4'.

Next, comparison will be made to the driving capabilities and loads of the respective blocks in the first and second circuits as follows.

[Group A: first circuit]:

9-6: Inverter V8 drives wiring 9-6+inverter V10+F/F F1.

[Group A: second circuit]:

9-6': Inverter V10 drives wiring 9-6'+F/F F2 and inverter V11.

[Group B: first circuit]:

9-5: Inverter V5 drives wiring 9-5+two inverters V6, V7.

[Group B: second circuit]:

9-5': Inverter V6 drives wiring 9-5'+two inverters V8, V9.

[Group C: first circuit]:

9-2: Inverter V1 drives wiring 9-2+inverter V2.

9-3: Inverter V2 drives wiring 9-3+NAND N1.

9-4: NAND N1 drives wiring 9-4+inverter V3.

[Group C: second circuit]:

9-2': Inverter V3 drives wiring 9-2'+inverter V4.

9-3': Inverter V4 drives wiring 9-3'+NAND N2.

9-4': NAND N2 drives wiring 9-4'+inverter V5.

As can be seen from the above, in each group, the first and second circuits are entirely coincident with each other in combinations of driving capabilities and driving capacities and the logic of the first circuit is inverted from that of the second circuit. Thus, the difference between a rising time (tr) and a falling time (tf) in the first circuit is canceled by the difference between a rising time (tr) and a falling time (tf) in the second circuit.

What is claimed is:

1. A semiconductor integrated circuit comprising:

a reference driving circuit;

a first circuit driven by a said reference driving circuit;

an inversion reference driving circuit inputting an output of said first circuit; and a second circuit driven by said inversion reference driving circuit, said first circuit and said second circuit having a substantially equal circuit arrangement and having the same combination of driving capability and driving capacity, and a difference between a rising time and a falling time of a signal generated in each circuit block of said first circuit being canceled by a difference between a rising time and falling time of a signal generated in a corresponding circuit block of said second circuit, wherein when said first circuit and said second circuit differ in circuit blocks and the number of different circuit blocks is odd, one circuit block is used as a dummy element; and when the number of the different circuit blocks is even, no circuit block is used as a dummy element.

2. A semiconductor integrated circuit comprising:

a reference driving circuit;

a first circuit driven by said reference driving circuit;

an inversion reference driving circuit inputting an output of said first circuit; and a second circuit driven by said inversion reference driving circuit, said first circuit and said second circuit having a substantially equal circuit arrangement and having the same combination of driving capability and driving capacity, and a difference between a rising time and a falling time of a signal generated in each circuit block of said first circuit being canceled by a difference between a rising time and falling time of a signal generated in a corresponding circuit block of said second circuit, wherein in an overall circuit formed by combining said first circuit and said second circuit, when one branch is necessary, an unnecessary circuit block after branching in said second circuit is used as a dummy element; and when two branches are necessary, no dummy element is necessary.

* * * * *